(12) United States Patent
Zuniga

(10) Patent No.: US 9,293,577 B2
(45) Date of Patent: Mar. 22, 2016

(54) LDMOS WITH NO REVERSE RECOVERY

(75) Inventor: Marco A. Zuniga, Palo Alto, CA (US)

(73) Assignee: Volterra Semiconductor LLC, San Jose, CA (US)

(*) Notice: Subject to any disclaimer, the term of this patent is extended or adjusted under 35 U.S.C. 154(b) by 467 days.

(21) Appl. No.: 12/750,568

(22) Filed: Mar. 30, 2010

(65) Prior Publication Data
US 2011/0241108 A1    Oct. 6, 2011

(51) Int. Cl.
  *H01L 29/66* (2006.01)
  *H01L 29/78* (2006.01)
  *H01L 29/423* (2006.01)
  *H01L 21/265* (2006.01)
  *H01L 29/08* (2006.01)

(52) U.S. Cl.
  CPC ...... *H01L 29/7816* (2013.01); *H01L 29/42368* (2013.01); *H01L 29/66681* (2013.01); *H01L 21/26586* (2013.01); *H01L 29/0878* (2013.01); *H01L 29/42372* (2013.01); *H01L 29/42376* (2013.01)

(58) Field of Classification Search
  CPC .................... H01L 29/42368; H01L 21/26586
  USPC .................... 257/337, 343, E27.016, E29.261
  See application file for complete search history.

(56) References Cited

U.S. PATENT DOCUMENTS

| 4,637,124 A | * | 1/1987 | Okuyama | H01L 29/78 257/E21.64 |
| 5,541,125 A | * | 7/1996 | Williams | H01L 21/8249 257/E21.375 |
| 5,585,657 A | * | 12/1996 | Efland | H01L 29/0696 257/335 |
| 6,441,431 B1 | | 8/2002 | Efland et al. | |
| 6,825,531 B1 | * | 11/2004 | Mallikarjuna swamy | H01L 29/7816 257/343 |
| 2003/0141559 A1 | * | 7/2003 | Moscatelli | H01L 21/28167 257/406 |
| 2004/0175891 A1 | * | 9/2004 | Mitros et al. | 438/276 |
| 2007/0063271 A1 | * | 3/2007 | Takimoto | H01L 29/7816 257/330 |
| 2007/0207600 A1 | * | 9/2007 | You | H01L 21/823814 438/527 |
| 2007/0246771 A1 | | 10/2007 | McCormack et al. | |
| 2008/0182394 A1 | | 7/2008 | Yang et al. | |
| 2008/0191277 A1 | * | 8/2008 | Disney | H01L 29/0638 257/343 |
| 2009/0072308 A1 | | 3/2009 | Chen et al. | |
| 2009/0116291 A1 | * | 5/2009 | Liu | 365/185.18 |
| 2009/0224739 A1 | | 9/2009 | Zuniga et al. | |
| 2010/0025756 A1 | * | 2/2010 | Fu | H01L 29/0634 257/328 |

OTHER PUBLICATIONS

Sherman, et al. "Synchronous Rectification: Improving the Efficiency of Buck Converter", EDN Design Feature, Mar. 14, 1996, downloaded from the internet at: http://www.edn.com/archives/1996/031496/06df4.htm on Feb. 6, 2009, 5 pages.

(Continued)

*Primary Examiner* — Vongsavanh Sengdara
(74) *Attorney, Agent, or Firm* — Lathrop & Gage LLP

(57) ABSTRACT

A transistor includes a source region including a first impurity region implanted into a substrate, a drain region including a second impurity region implanted into the substrate, and a gate including an oxide layer formed over the substrate and a conductive material formed over the oxide layer, the oxide layer comprising a first side and a second side, the first side formed over a portion of the first impurity region and the second side formed over a portion of the second impurity region, the first side having a thickness of less than about 100 Å, and the second side having a thickness equal to or greater than 125 Å.

16 Claims, 10 Drawing Sheets

(56) References Cited

OTHER PUBLICATIONS

Wikipedia "Buck Converter", downloaded from the internet at http://en.wikipedia.org/wiki/Buck_Converter on Feb. 5, 2009, 13 pages.
Wikipedia "Diode", downloaded from the internet at http://en.wikipedia.org/wiki/Diode on Mar. 9, 2009, 13 pages.
Wikipedia "Transistor", downloaded from the internet at http://en.wikipedia.org/wiki/Transistor on Feb. 5, 2009, 12 pages.
PCT/ISA/210 (International Search Report) for International Application No. PCT/US2011/030001 dated Dec. 13, 2011.
PCT/ISA/237 (Written Opinion) for International Application No. PCT/US2011/030001 dated Dec. 13, 2011.
PCT Notification Concerning Transmittal of International Preliminary Report on Patentability and Written Opinion of the International Searching Authority from International Application No. PCT/US2011/030001 dated Oct. 11, 2012. (7 pages).
Chinese Patent Application No. 201180020578.8, First Office Action issued Dec. 3, 2014 and English-language translation thereof, 23 pages.
Concise Explanation of Sep. 1, 2015 Office Action in Taiwanese Patent Application No. 100111058, 10 pages.
Office Action in Taiwanese Patent Application No. 100111058 dated Sep. 1, 2015, 15 pages.

* cited by examiner

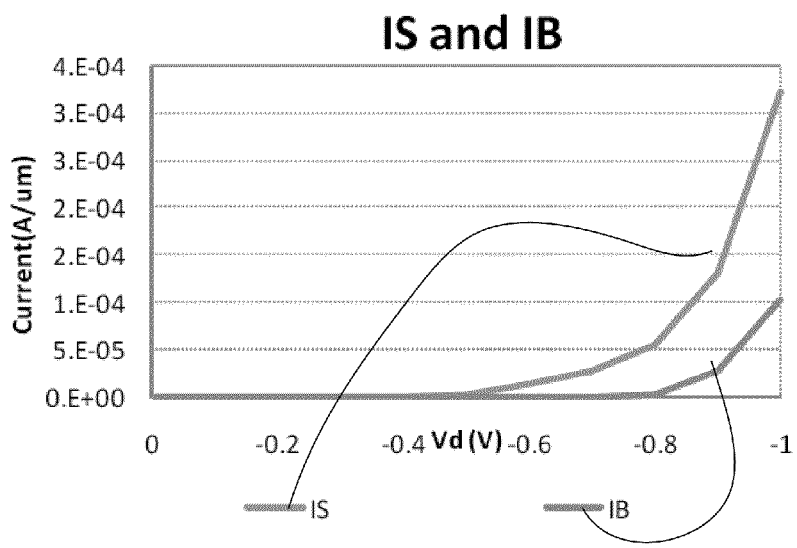
FIG. 7A
FIG. 7B
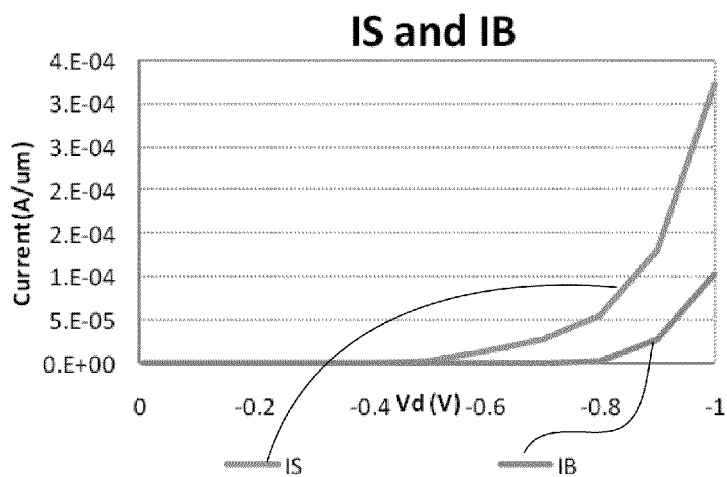
FIG. 8A
FIG. 8B

| S/N | Species | Energy | Tilt | Dose | Rotate | Vt (V) |
|---|---|---|---|---|---|---|
| 1 | Ph | 70 | 7 | 1.125E+13 | 22.5 | |
| 2 | Ph | 70 | 15 | 12E+13 | 22.5 | 1.8 |
|  |  |  |  | 1E+13 |  | 0.8 |
|  |  |  |  | 1E+12 |  | 0.7 |

LDMOS WITH NO REVERSE RECOVERY

TECHNICAL FIELD

The present disclosure relates generally to semiconductor devices, and more particularly to a lateral double-diffused metal oxide semiconductor (LDMOS) device.

BACKGROUND

Voltage regulators, such as DC to DC converters, are used to provide stable voltage sources for electronic systems. Efficient DC to DC converters are particularly needed for power management in low power devices, such as laptop notebooks and cellular phones. Switching voltage regulators (or simply "switching regulators") are known to be an efficient type of DC to DC converter. A switching regulator generates an output voltage by converting an input DC voltage into a high frequency voltage, and filtering the high frequency input voltage to generate the output DC voltage. Specifically, the switching regulator includes a switch for alternately coupling and decoupling an input DC voltage source, such as a battery, to a load, such as an integrated circuit. An output filter, typically including an inductor and a capacitor, is coupled between the input voltage source and the load to filter the output of the switch and thus provide the output DC voltage. A controller, such as a pulse width modulator or a pulse frequency modulator, controls the switch to maintain a substantially constant output DC voltage.

LDMOS (laterally diffused metal oxide semiconductor) transistors are used in switching regulators as a result of their specific on-resistance and drain-to-source breakdown voltage.

SUMMARY

In one aspect, a transistor includes a source region including a first impurity region implanted into a substrate, a drain region including a second impurity region implanted into the substrate, and a gate including an oxide layer formed over the substrate and a conductive material formed over the oxide layer, the oxide layer comprising a first side and a second side, the first side formed over a portion of the first impurity region and the second side formed over a portion of the second impurity region, the first side having a thickness of less than about 100 Å, and the second side having a thickness equal to or greater than 125 Å.

Implementations may include one or of the following features. The thickness of the second side may be at least five times the thickness of the first side. The thickness of the first side may be about 70 Å or less. The thickness of the first side may be about 35 Å or less. The source may include a third self-aligned impurity region. A maximum doping concentration of the third impurity region may be between about $1\times10^{17}$ atoms/cm$^2$ and $1\times10^{18}$ atoms/cm$^2$. A doping concentration of the third impurity region at a surface adjacent to the oxide layer may be less than about $5\times10^{17}$ atoms/cm$^2$. The doping concentration may be less than about $3\times10^{17}$ atoms/cm$^2$. The third impurity region may be positioned in a current path of the transistor. The second side may have a thickness of between approximately 120 Å and 800 Å, e.g., between approximately 200 Å and 400 Å. The transistor may be a lateral double-diffused metal oxide semiconductor (LDMOS).

In another aspect, a transistor includes a source region including a first impurity region implanted into a substrate, a drain region including a second impurity region implanted into the substrate, and a gate including an oxide layer formed over the substrate and a conductive material formed over the oxide layer, the oxide layer comprising a first side and a second side, the first side formed over a portion of the first impurity region and the second side formed over a portion of the second impurity region, the first side having a thickness such that a turn-on voltage of the transistor is less than 0.6V.

Implementations may include one or of the following features. The turn-on voltage of the transistor may be between 0.4 and 0.5V. The source may include a third self-aligned impurity region. A maximum doping concentration of the third impurity region may be between about $1\times10^{17}$ atoms/cm$^2$ and $1\times10^{18}$ atoms/cm$^2$. A doping concentration of the third impurity region at a surface adjacent to the oxide layer may be less than about $5\times10^{17}$ atoms/cm$^2$. The doping concentration may be less than about $3\times10^{17}$ atoms/cm$^2$. The third impurity region may be positioned in a current path of the transistor. The transistor may be a lateral double-diffused metal oxide semiconductor (LDMOS).

In another aspect, a transistor includes a source region including a first impurity region implanted into a substrate, a drain region including a second impurity region implanted into the substrate, an intrinsic diode, and a gate including an oxide layer formed over the substrate and a conductive material formed over the oxide layer, the oxide layer comprising a first side and a second side, the first side formed over a portion of the first impurity region and the second side formed over a portion of the second impurity region, the first side having a thickness such that a turn-on voltage of the transistor is less than a turn-on voltage of the intrinsic diode.

Implementations may include one or of the following features. The turn-on voltage of the transistor is between 0.4 and 0.6V. The source may include a third self-aligned impurity region. A maximum doping concentration of the third impurity region may be between about $1\times10^{17}$ atoms/cm$^2$ and $1\times10^{18}$ atoms/cm$^2$. A doping concentration of the third impurity region at a surface adjacent to the oxide layer may be less than about $5\times10^{17}$ atoms/cm$^2$. The doping concentration may be less than about $3\times10^{17}$ atoms/cm$^2$. The third impurity region may be positioned in a current path of the transistor. The transistor may be a lateral double-diffused metal oxide semiconductor (LDMOS).

In another aspect, a method of making a transistor includes applying a photoresist over a gate, the gate including an oxide layer formed over a substrate and a conductive material formed over the oxide layer, using the photoresist as a mask, etching the gate to remove a portion of the conductive material, and using the photoresist and conductive material as a mask, implanting an impurity region into the substrate such that the impurity region is self-aligned to the gate.

Implementations may include one or of the following features. The oxide layer may be formed such that a first side of the oxide layer is thinner than a second side of the oxide layer. The first side may have a thickness of less than about 100 Å, and the second side may have a thickness that it at least five times the thickness of the first side. The photoresist may be less than about 0.5 μm thick. Implanting an impurity region may include bombarding the substrate with atoms at an angle that is less than 90° from a main surface of the substrate. Implanting an impurity regions may continues until a doping concentration of the substrate is between about $1\times10^{13}$ atoms/cm$^2$ and $5\times10^{18}$ atoms/cm$^2$.

In another aspect, a method of making a transistor includes etching a first side of a gate, the gate including an oxide layer formed over a substrate and a conductive material formed over the oxide layer, the etching removing a first portion of the conductive material, implanting an impurity region into the substrate such that the impurity region is self-aligned, and etching a second side of the gate to remove a second portion of the conductive material.

Implementations may include one or of the following features. The oxide layer may be formed such that a first side of the oxide layer is thinner than a second side of the oxide layer. The first side may have a thickness of less than about 100 Å, and the second side may have a thickness that it at least five times the thickness of the first side. Implanting an impurity region may include bombarding the substrate with atoms at an that is less than 90° from a main surface of the substrate. Implanting the impurity region may continue until a doping concentration of the substrate is between about $1 \times 10^{13}$ atoms/$cm^2$ and $5 \times 10^{18}$ atoms/$cm^2$.

In another aspect, a method of making a transistor includes applying a first photoresist over a gate, the gate including an oxide layer formed over a substrate and a conductive material formed over the oxide layer, using the first photoresist as a mask, etching a first side of the gate to remove a first portion of the conductive material, implanting an impurity region into the substrate such that the impurity region is self-aligned, applying a second photoresist over the gate, and using the second photoresist as a mask, etching a second side of the gate to remove a second portion of the conductive material.

In another aspect, a method of making a integrated circuit includes forming a plurality of LDMOS transistors on a substrate, each LDMOS transistor including a gate oxide layer comprising a first side closer to a source side of the LDMOS transistor and a second side closer to the drain side of the LDMOS transistor, the first side having a thickness of less than about 100 Å, and the second side having a thickness equal to or greater than 125 Å, and forming a plurality of CMOS transistor on the substrate, wherein each CMOS transistor includes a gate oxide layer, and wherein forming the gate oxide layer of the CMOS transistor occurs simultaneously with forming the first side of the gate oxide layer of the LDMOS transistor.

Implementations may include one or of the following features. The gate of oxide layer of the CMOS transistor may be formed with the same thickness as the first side of the gate oxide layer of the LDMOS transistor. The thickness of the second side may be at least five times the thickness of the first side. The thickness of the first side may be about 70 Å or less, e.g., about 35 Å or less. Forming the plurality of LDMOS transistors may include depositing an LDMOS gate conductor and forming the plurality of CMOS transistor may include depositing a CMOS gate conductor, and the LDMOS gate conductor and CMOS gate conductor may be deposited simulataneously. The LDMOS gate conductor and CMOS gate conductor may be polysilicon. The gate oxide layer of the CMOS gate may have a substantially uniform thickness.

Certain implementations may have one or more of the following advantages. A transistor having a gate oxide that is less than about 40 Å can make the turn-on voltage of the transistor be less than the turn-on voltage of the intrinsic diode. A transistor having a turn-on voltage that is less than the turn-on voltage of the intrinsic diode can reduce the recovery time of the transistor. Reducing the recovery time can increase the efficiency of the transistor, particularly at high switching rates. Applying a photoresist over the gate before implanting the p-body can give an added layer of protection to avoid unwanted implantation of impurities in the substrate. Etching through the polygate a first time before implanting the p-body and then etching through the polygate a second time after implanting the p-body ensures that a p-body is implanted only on the source side of the transistor, rather than on both the source and the drain side.

The details of one or more embodiments are set forth in the accompanying drawings and the description below. Other features, aspects, and advantages will become apparent from the description, the drawings, and the claims.

BRIEF DESCRIPTION OF THE DRAWINGS

FIGS. 7A and 7B are a chart, and corresponding graph, showing the characteristics of a transistor having a thin gate oxide thickness of 35 Å.
FIGS. 8A and 8B are a chart, and corresponding graph, showing the characteristics of a transistor having a thin gate oxide thickness of 70 Å.

Like reference numbers and designations in the various drawings indicate like elements.

DETAILED DESCRIPTION

When a transistor is used in synchronous rectification in a switching regulator, efficiency losses occur as a result of reverse recovery of the intrinsic body diode charge up during deadtime, as well as diode conduction during deadtime. By having a transistor in which the turn-on voltage of the transistor is less than the turn-on voltage of the intrinsic diode, the efficiency of the switching regulator can be enhanced by reducing both mechanisms of loss associated with parasitic diodes. The lower threshold voltage prevents minority carrier storage. Moreover, the conduction losses during deadtime will decrease by the ratio of threshold voltage to diode turn-on voltage.

Figure 1:
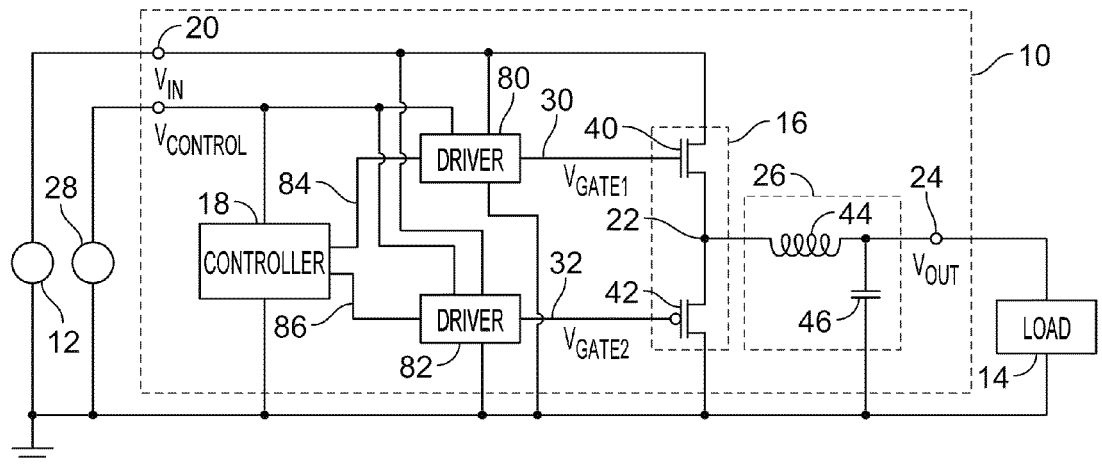
FIG. 1 is a circuit diagram of a buck converter.

Referring to FIG. 1, a switching regulator 10 is coupled to a first high DC input voltage source 12, such as a battery, by an input terminal 20. The switching regulator 10 is also coupled to a load 14, such as an integrated circuit, by an output terminal 24. The switching regulator 10 serves as a DC-to-DC converter between the input terminal 20 and the output terminal 24. The switching regulator 10 includes a switching circuit 16 which serves as a power switch for alternately coupling and decoupling the input terminal 20 to an intermediate terminal 22. The switching circuit 16 includes a rectifier, such as a switch or diode, coupling the intermediate terminal 22 to ground. Specifically, the switching circuit 16 may include a first transistor 40, called a high-side transistor, having a source connected to the input terminal 20 and a drain connected to the intermediate terminal 22 and a second transistor 42, called a low-side transistor, or synchronous transistor, having a source connected to ground and a drain connected to the intermediate terminal 22.

In one implementation, the first transistor 40 can be a Positive-Channel Metal Oxide Semiconductor (PMOS) transistor, and the second transistor 42 can be a Negative-Channel Metal Oxide Semiconductor (NMOS) transistor. In another implementation, the first transistor 40 and the second transistor 42 can both be NMOS transistors. In another implementation, the first transistor 40 can be a PMOS, NMOS, or a Lateral Double-diffused Metal Oxide Semiconductor (LDMOS), and the second transistor 42 can be an LDMOS.

The intermediate terminal 22 is coupled to the output terminal 24 by an output filter 26. The output filter 26 converts the rectangular waveform of the intermediate voltage at the intermediate terminal 22 into a substantially DC output voltage at the output terminal 24. Specifically, in a buck-converter topology, the output filter 26 includes an inductor 44 connected between the intermediate terminal 22 and the output terminal 24 and a capacitor 46 connected in parallel with the load 14. During a high-side conduction period, the first transistor is closed, and the source 12 supplies energy to the load 14 and the inductor 44 via the first transistor 40. On the other hand, during a low-side conduction period, the second transistor 42 is closed, and current flows through the second transistor 42 as energy is supplied by the inductor 44. The resulting output voltage $V_{out}$ is a substantially DC voltage.

The switching regulator also includes a controller 18, a high-side driver 80 and a low-side driver 82 for controlling the operation of the switching circuit 16. A first control line 30 connects the high-side transistor 40 to the high-side driver 80, and a second control line 32 connects the low-side transistor 42 to the low-side driver 82. The high-side and low-side drivers are connected to the controller 18 by control lines 84 and 86, respectively. The controller 18 causes the switching circuit 16 to alternate between high-side and low-side conduction periods so as to generate an intermediate voltage Vint at the intermediate terminal 22 that has a rectangular waveform. The controller 16 can also include a feedback circuit (not shown), which measures the output voltage and the current passing through the output terminal. Although the controller 18 is typically a pulse width modulator, the invention is also applicable to other modulation schemes, such as pulse frequency modulation.

Figure 2:
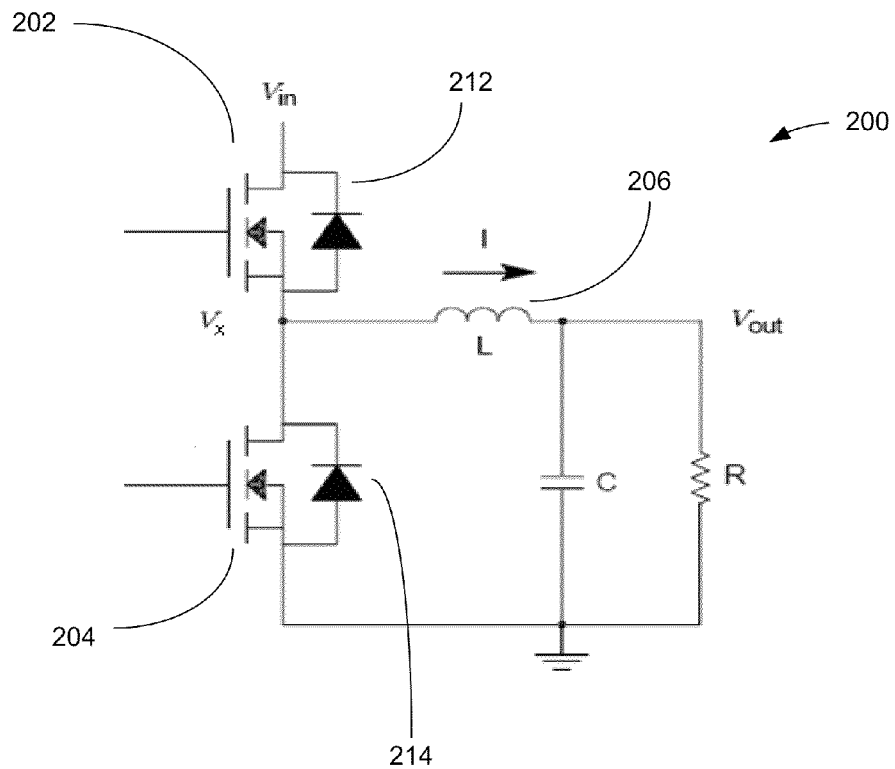
FIG. 2 is a simplified circuit diagram of a buck converter.

A simplified circuit diagram of a buck converter 200 is shown in FIG. 2. The buck converter 200 includes a high-side transistor 40, a low-side transistor 42, and an inductor 206. Each transistor has a corresponding intrinsic body diode, 212 and 214, respectively. A voltage $V_{in}$, for example 12V, is applied to the high-side transistor 40, and when the high-side transistor 40 is on, current will flow through the transistor 40 and the inductor 206. In contrast, when the low-side transistor 42 is on, the inductor 206 will pull current from ground. Under normal operation of the buck circuit 200, the regulator will switch between turning the high-side transistor 40 and the low-side transistor 42 on so that the output of the filter 26 produces the desired voltage $V_{out}$ ($V_{out}$ somewhere between 0V and $V_{in}$).

To improve efficiency of the buck converter 200, it is desirable to have the high-side transistor 40 on while the low-side transistor 42 is off, and vice versa. However, some downtime is required between the switching in order to avoid having both transistors 40, 42 on and at same time, which can cause shoot-through and result in significant efficiency losses and damage to the transistors. Thus, there is a short period, the intrinsic deadtime $t_d$, between each high-side conduction and low-side conduction period in which both transistors are open.

When both transistors 40, 42 are off, current through the inductor 206 will not instantly drop to zero. The voltage across the inductor is determined by Equation 1:

$$V=L(di/dt),$$  (Equation 1)

where V is the voltage, L is the inductance, and i is the current in the inductor. As the inductor current decreases, the voltage at the input end, i.e. near $V_{in}$, of the inductor is forced to be negative. When this voltage reaches approximately −0.7 V, the low-side body diode 214 reaches its threshold voltage and begins conducting current into the inductor. As a result, in a traditional buck converter, the current will travel through the diode 214.

When the current flows through the low-side diode, a number of losses in efficiency can result. The most significant loss is associated with reverse recovery. The reverse recovery loss is the loss associated with taking the forward conducting diode from forward to reverse bias. Reverse recovery occurs when the high-side transistor is switched on. In the period before the high-side transistor is switched on, the low-side body diode is forward biased with the inductor drawing current through the diode from ground. In this state, the PN junction of the low-side diode conducts, the depletion region is narrowed to its minimum width, and a buildup of charge carriers is formed on each side of the diode's PN junction. When the high-side transistor is switched on, the low-side diode goes from being forward biased at 0.7 V to being negative biased at −12 V. However, the low-side diode does not instantaneously switch off because the same buildup of charge carriers that allowed conduction across the PN junction during forward bias causes a transient charge to be depleted in negative bias. The reverse recovery loss is thus a current that flows through the high-side transistor in order to restore the equilibrium reverse-biased charge across the low-side's PN junction.

Figure 3:
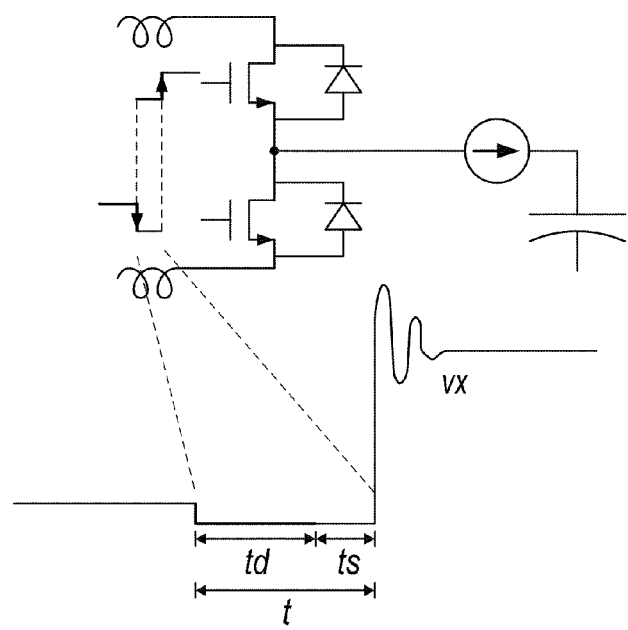
FIG. 3 is a graph demonstrating the deadtime of a traditional buck converter.

The total amount of the diode recovery loss depends upon the output current, the parasitic inductance, and the high side drive capability. As shown in FIG. 3, the total deadtime t includes both the intrinsic deadtime $t_d$ and the reverse recovery time $t_s$. The reverse recovery time $t_s$ can account for a large fraction, e.g. more than 25% of the deadtime of the transistor.

Figure 4:
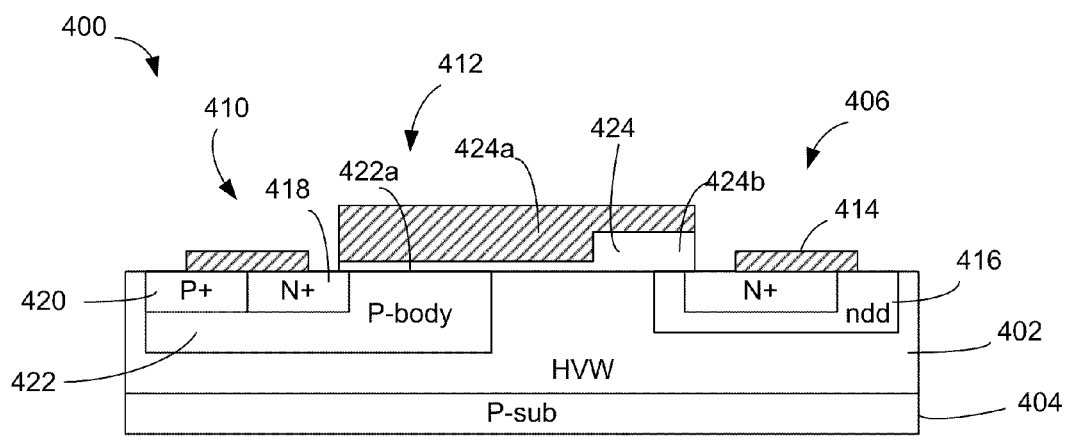
FIG. 4 is a schematic of an LDMOS transistor.

FIG. 4 shows a schematic cross-sectional view of an LDMOS transistor 400 that could be used, for example, as a transistor in a buck converter, e.g., as the low side transistor 42, as discussed above. The LDMOS transistor 400 can be fabricated on a high voltage n-type well 402 implanted in a p type substrate 404. A high voltage n-well implant is typically a deep implant and is generally more lightly doped relative to a CMOS n-well. The LDMOS transistor 400 includes a drain region 406, a source region 410, and a gate 412 with a stepped gate oxide layer 424. The drain region 406 includes a doped n+ region 414 and an n doped shallow drain 416. The source region includes an n-doped n+ region 418, a p-doped p+ region 420, and a p-doped p-body 422. The impurities that provide the n-well 402, the n-doped shallow drain 416, and the n+ regions 414, 418 are a first type of doping material, for example phosphorous. Both the n-doped shallow drain 416 and the n-well 402 have lower concentrations of impurities than the n+ regions 414, 418. Likewise, the impurities that provide the p+ region 420 and the p-body 422 are a second opposite type of doping material, for example boron. The p-body 422 can be self-aligned with the gate 412. In other words, the source-side edge of the gate and the gate-side edge of the p-body can be substantially aligned (subject to implantation effects that can force a portion of the p-body 422 below the gate). Alternatively, the p-body 422 need not be self-aligned with the gate 412.

Figure 5A:
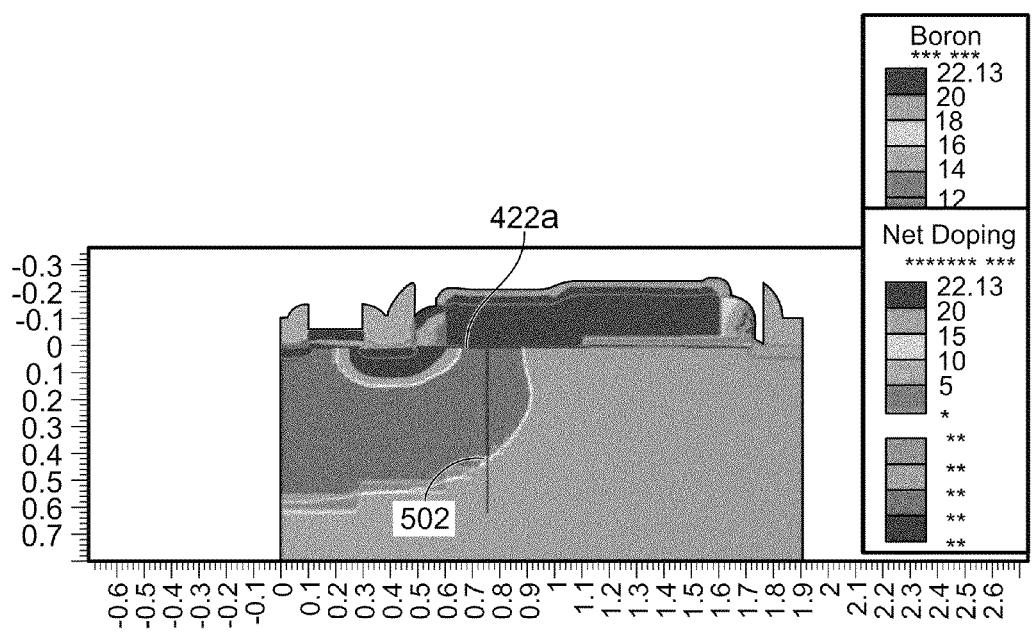
FIGS. 5A and 5B are schematics of an exemplary impurity profile in a transistor as described herein.
Figure 5B:
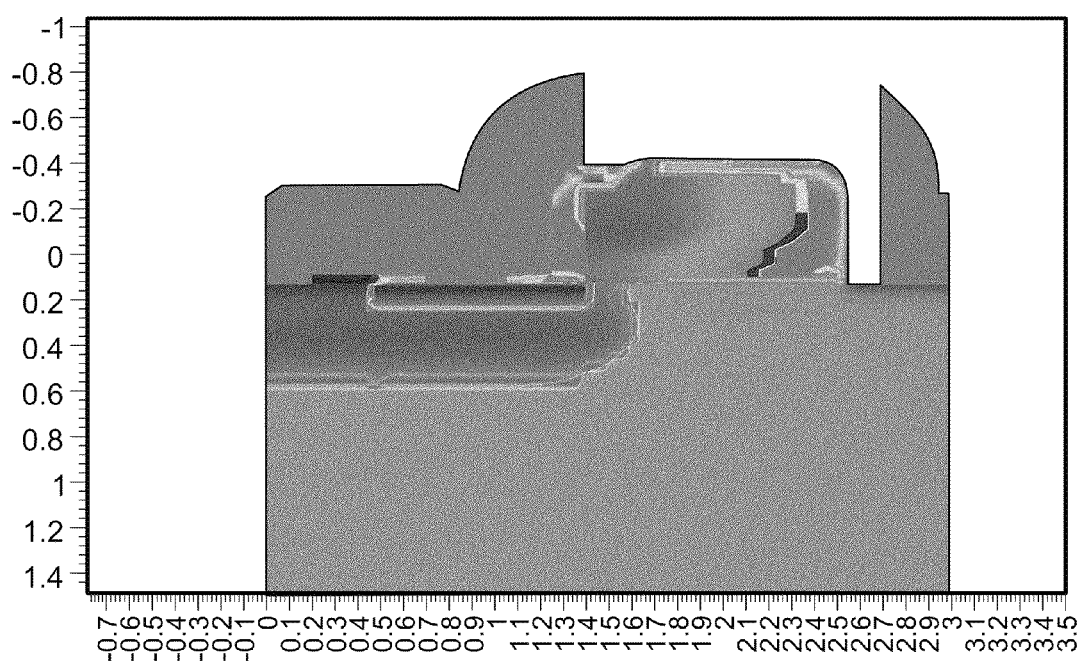

The p-body can have a maximum doping concentration of, for example, $1 \times 10^{17}$ atoms/cm² to $1 \times 10^{18}$ atoms/cm². Moreover, the doping concentration at the top surface 422a of the p-body can be less than about $5 \times 10^{17}$ atoms/cm$^2$, such as less than $3 \times 10^{17}$ atoms/cm$^2$, for example $2 \times 10^{17}$ atoms/cm$^2$. Exemplary doping profile is shown in FIGS. 5A and 5B.

Referring back to FIG. 4, the oxide layer 424 is located underneath the gate 412 and includes two portions, thin portion 424a and thick portion 424b. Thin portion 424a can be closer to the source 410 than thick portion 424b and can partially overlap the n+ region 418 and the p-body 422. Thick portion 424b can be closer to the drain 406 than thin portion 424a and can partially overlap the n+ region 414 and the shallow drain 406. As shown in FIG. 4, thin portion 424a can be thinner than thick portion 424b. Thin portion 424a can be less than 100 Å thick, such as less than 40 Å thick, for example 35 Å. In contrast, thick portion 424b can be at least five times as thick as the thin portion 424a, such as at least 10 times as thick, for example between 200 Å and 400 Å thick.

For the LDMOS transistor 400, a high enough positive voltage on the gate 412, called the turn-on voltage ($V_t$), will push the positive holes of the p-body 422 away from the gate 412 to form a depletion layer. This will create a channel for electrons (n) (an "n-channel") to flow between the source 410 and the drain 406. Varying the voltage between the gate 412 and the substrate 404 modulates the conductivity of the n-channel and makes it possible to control the current flow between drain and source.

The thin portion 424a of the oxide layer 424, in combination with having a p-body profile as described above, can affect the turn-on voltage ($V_t$) of the gate and transistor. As the thin portion 242a is made thinner, the turn-on voltage will be reduced. Further, the lower the concentration of the p-body, the lower the turn-on voltage.

By appropriate selection of the thickness of the thin portion of the oxide layer and reducing the concentration of the p-body, the turn-on voltage ($V_t$) of the transistor can be less than the turn-on voltage ($V_{be}$) of the intrinsic diode. For example, the turn-on voltage of the transistor can be less than 0.6V. Advantageously, by making $V_t$ less than $V_{be}$ for the low-side transistor of a buck converter, the transistor can enter third-quadrant conduction during deadtime, causing current to travel through the transistor instead of the body diode.

Lowering $V_t$ such that the current goes through the transistor instead of the body diode can eliminate the reverse recovery time, thereby greatly enhancing the efficiency of the buck converter. Additionally, power is saved because there is no need to discharge the minority carriers that would otherwise form the reverse recovery charge on the body diode during reverse conduction. If the turn-on voltage of the transistor is too low, however, the ringing caused by switching between the high-side transistor and low-side transistor can unintentionally activate the gate. Therefore, the thickness of the thin portion and the concentration of the p-body can be balanced such that the turn-on voltage of the transistor is between 0.4V and 0.5V.

Figure 6:
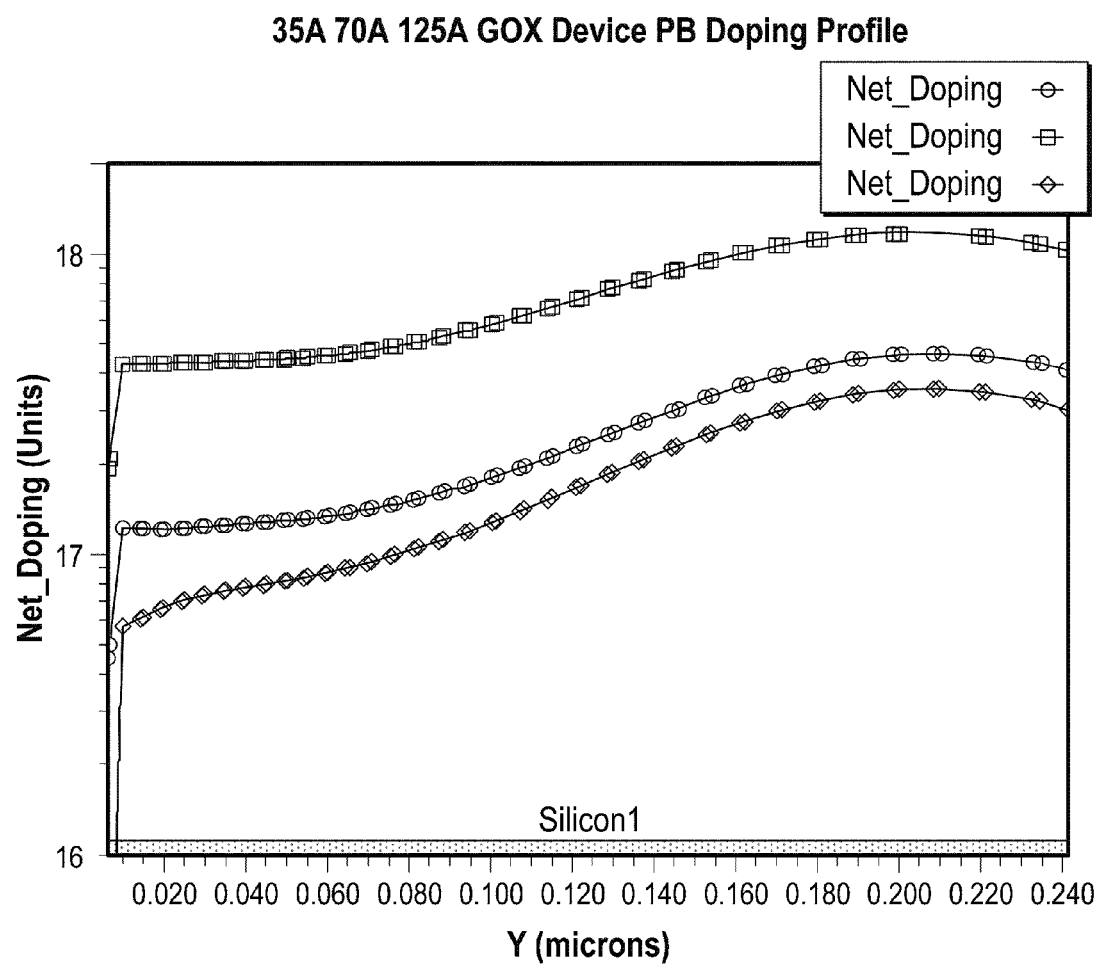
FIG. 6 is a graph of doping vs. distance from the surface for a transistor having a thin gate oxide thickness of 35 Å, 70 Å, and 125 Å, respectively.

FIG. 6 shows an exemplary graph of net doping vs. distance into the p-body from a top surface of the p-body 422a (along the line 502 from FIG. 5). In the exemplary embodiments shown in FIG. 6, a thin oxide layer of 35 Å requires a surface doping concentration of approximately $2 \times 10^{17}$ atoms/cm$^2$. A thin oxide layer of 70 Å requires a surface doping concentration of approximately $5 \times 10^{16}$. Moreover, a thin oxide layer of 125 Å requires a surface doping concentration of less than $1 \times 10^{16}$. Therefore, the thinner the thin oxide layer is, the greater the maximum doping concentration can be to achieve a $V_t$ that is less than $V_{be}$.

Figures 9A, 9B:
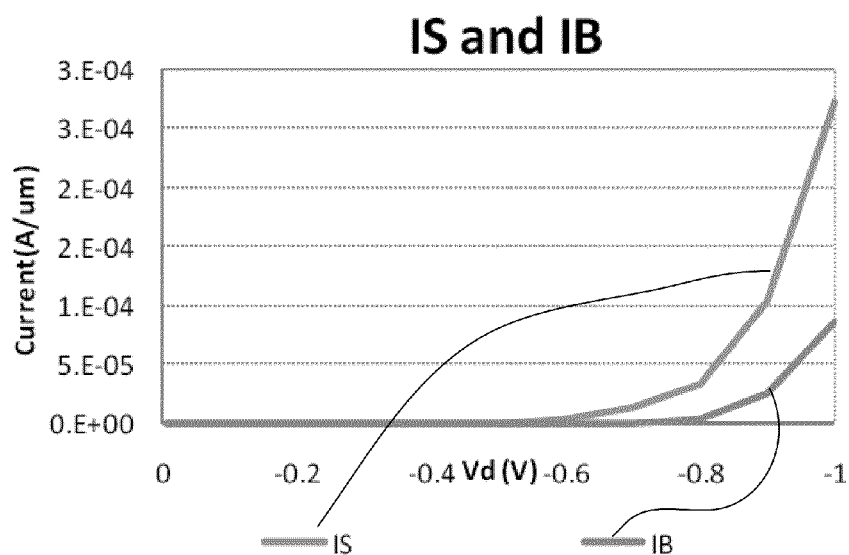
FIGS. 9A and 9B are a chart, and corresponding graph, showing the characteristics of a transistor having a thin gate oxide thickness of 125 Å.

As shown in the exemplary embodiments of FIGS. 7A-8B, a device having a thin oxide, e.g. less than 100 Å, such as 35 Å (FIGS. 7A-7B) or 70 Å (FIGS. 8A-8B), and the proper p-body concentration, a current through the transistor (IS) can be much greater than the current through the diode (IB). Moreover, provided that the applied voltage is between approximately 0.4V and 0.8V, no current will go through the diode. However, referring to FIGS. 9A and 9B, if the thin oxide thickness rises to above 100 Å, such as 125 Å, then a much smaller voltage window, e.g. between 0.65 and 0.8V is available in which no current goes through the diode. Moreover, more doping steps are required to get the necessary p-body concentration.

Varying the Vt of the low-side transistor requires additional semiconductor processing steps. To achieve a Vt of approximately 0.4 V, it is helpful to fashion the transistor so that the oxide beneath the gate is thinner where it contacts the source of the transistor than where it contacts the drain of the transistor because the thinner the oxide, the lower the Vt for a given surface doping. This thin oxide is not suitable for the drain side of the gate, however, because it would compromise the breakdown voltage (BVDSS) of the transistor. Accordingly, the must be shaped as a "step," with the drain side being thicker than the source side.

Figure 10A:
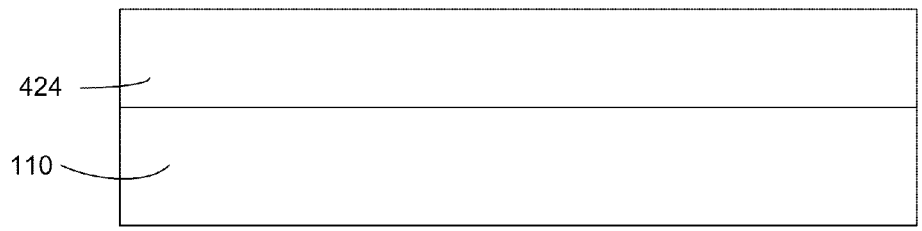
FIGS. 10A-10K show an exemplary process of forming a transistor.

Referring to FIG. 10A, the process of making the transistor begins by forming an oxide layer 424 on a silicon layer 110.

Figure 10B:
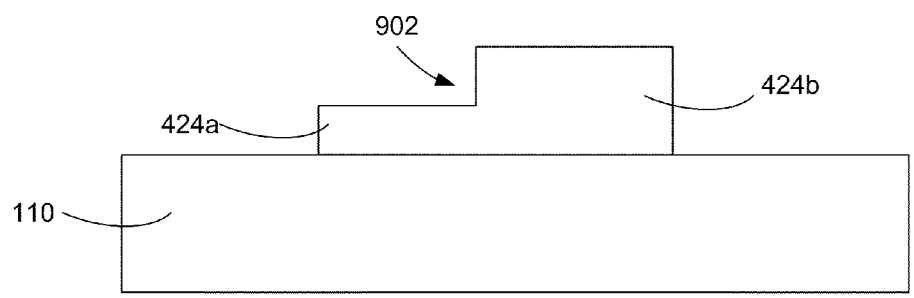

Referring to FIG. 10B, the oxide layer is patterned to define the gate oxide regions. In addition, a step 902 is formed in the oxide layer 424, creating a thin oxide portion 424a and a thick oxide portion 424b. The thin oxide portion 424a can be on the source side of the gate, whereas the thick oxide portion 424b can be on the drain side of the gate. The step 902 could be formed before or after the oxide layer is patterned. The thin oxide portion 424a can also be deposited simultaneously on any CMOS devices on the substrate, e.g., using a single mask.

In some implementation, the step 902 in the oxide can be formed by growing a thin oxide layer, masking the substrate (including the thin portion 424a) except for where the thick portion is desired, and depositing, e.g., using chemical vapor deposition, the remaining oxide in the unmasked area to form the thick portion 424b. In other implementations, the step 902 can be formed by growing a thick oxide layer, masking the substrate (including the thick portion 424b) except where the thin portion is desired, etching the exposed portion of the oxide layer down to the silicon layer, and growing the thin oxide layer 424a in the region that was etched away, e.g., using the same mask that was used in the etching step. In either process, the mask can then be removed.

Figure 10C:
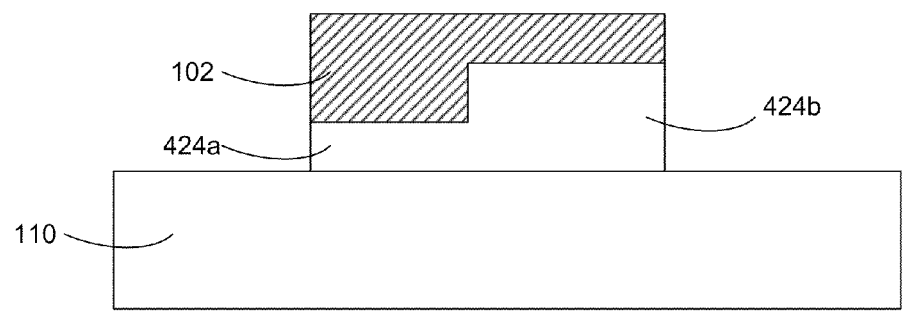

Referring to FIG. 10C, the gate conductor 102, e.g. a polysilicon layer, is applied over the oxide layer 424. The gate conductor, e.g. polysilicon layer, can be approximately 0.2-0.5 μm thick depending on the base process technology node. The gate conductor 102 can also be deposited simultaneously on any CMOS devices on the substrate, e.g., using a single mask.

Figure 10D:
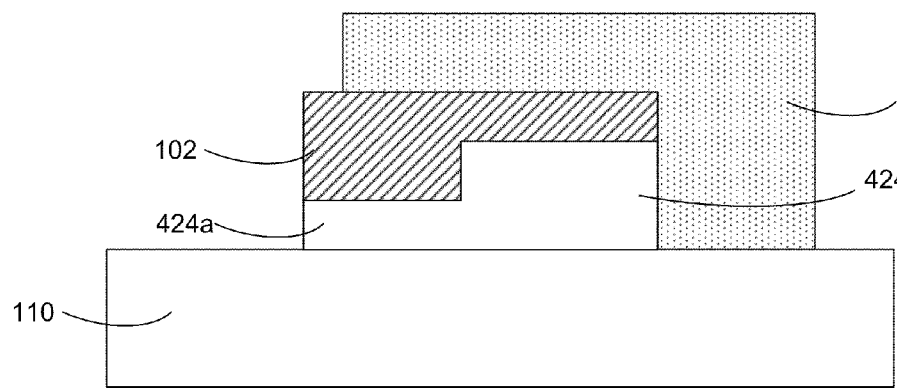

Referring to FIG. 10D, photoresist 104 is deposited, e.g., by spin coating, over the gate conductor 102, and patterned to expose at least the source side of the transistor. The photoresist can have a thickness of greater than 0.5 μm. Optionally, some portions of the gate conductor 102 on the source side 120 can also be exposed.

Figure 10E:
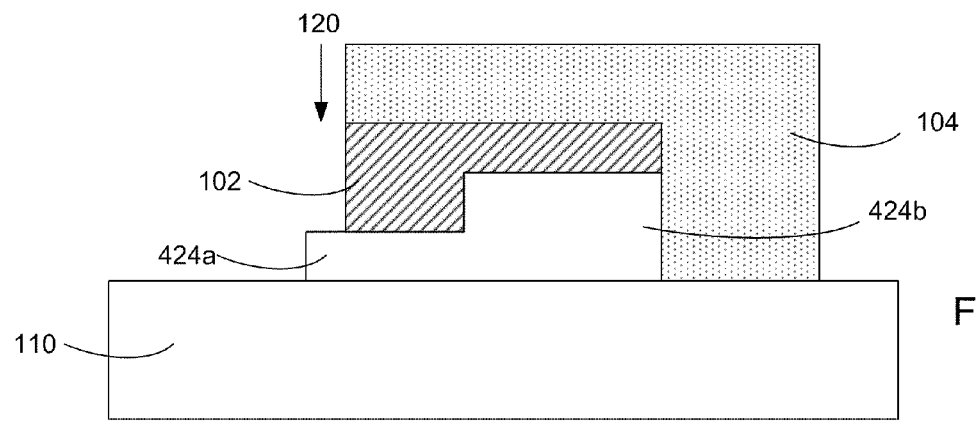

Referring to FIG. 10E, the exposed portion of the gate conductor 102 on the source side 120 of the transistor is then removed by etching using the photoresist 104 as a mask, e.g., using dry plasma etching. The photoresist 104 can thus act as a mask during the etch.

Figure 10F:
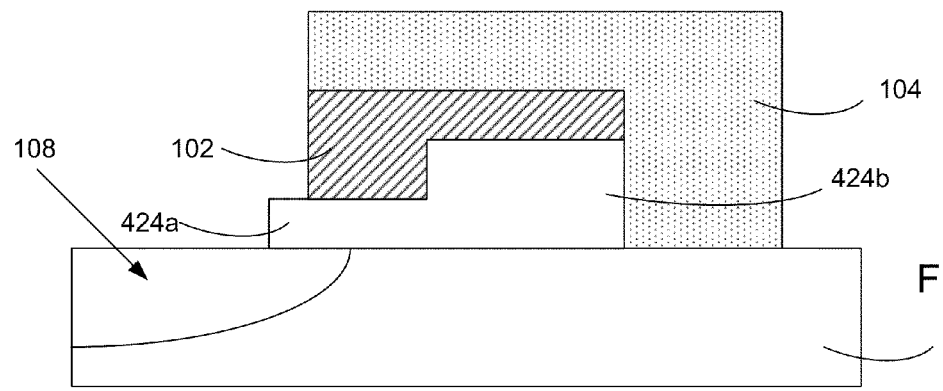

Referring to FIG. 10F, the p-body 422 is implanted using the combined photoresist 104 and remaining gate conductor 102 as a mask. The p-body 422 is implanted by bombarding the surface of the oxide 424a with the implant atoms. The implant can be performed at an angle to the main surface of the oxide 424*a* (shown by arrow 108). Because both the gate conductor 102 and the photoresist 104 are used as a mask, the resulting p-body 422 can be self-aligned to the gate, particularly to the source side of the gate conductor.

Figure 10G:
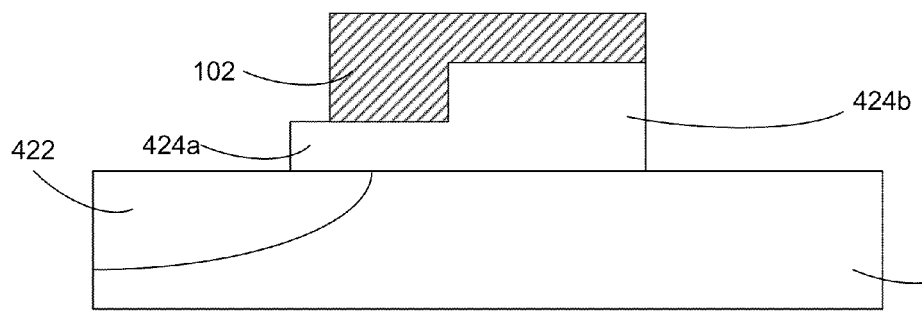

Referring to FIG. 10G, the photoresist layer 104 is then stripped from the surface.

Figure 10H:
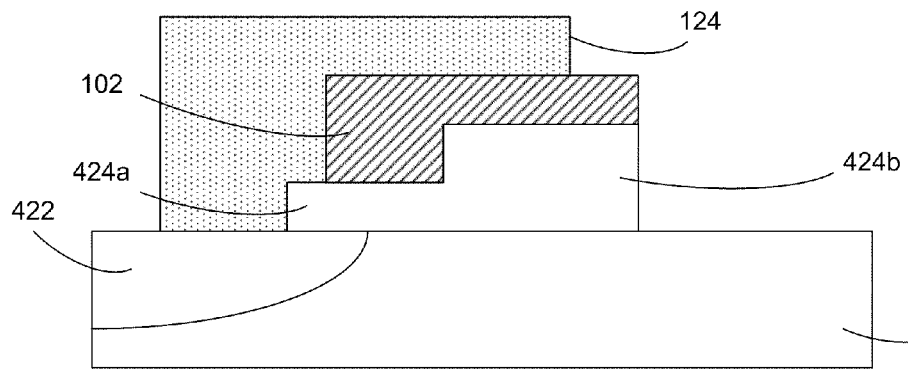

Referring to FIG. 10H, a new layer of photoresist 124 is applied, e.g., by spin coating, over the exposed surfaces, including the exposed portion of the oxide layer 424*a* on the source side 120 following the etch of the gate conductor 102 on the source side 120. The photoresist layer 104 is patterned to expose at least the drain side of the transistor. Optionally, some portions of the gate conductor 102 on the drain side 122 can be exposed.

Figure 10I:
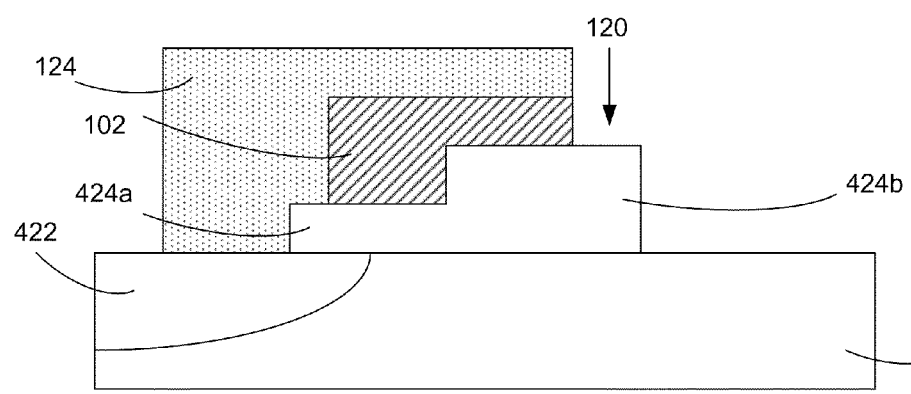

Referring to FIG. 10I, the exposed portion of the gate conductor on the drain side 122 is then removed by etching, e.g., dry plasma etching, using the photoresist 124 as a mask. The photoresist 124 also serves to protect the implanted p-body on the source side 120 during the etching process.

Figure 10J:
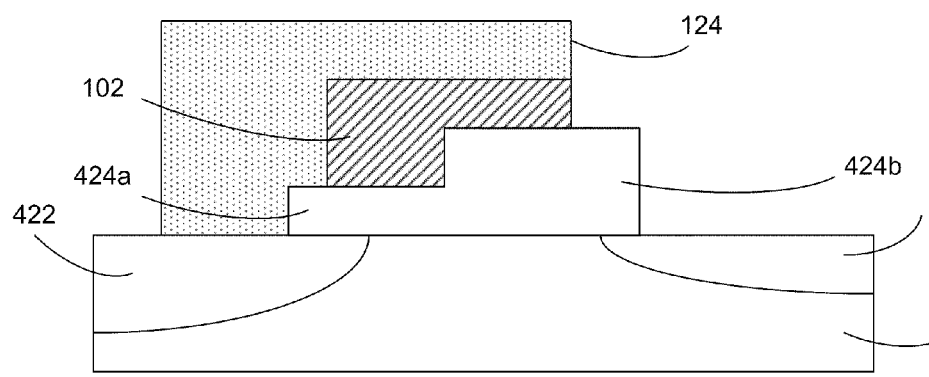

Referring to FIG. 10J, the NDD 415 can be implanted using the combined photoresist 124 and remaining gate conductor 102 as a mask. Because both the gate conductor 102 and the photoresist 124 are used as a mask, the NDD 415 can be self-aligned to the gate, particularly to the drain side of the gate conductor.

Figure 10K:
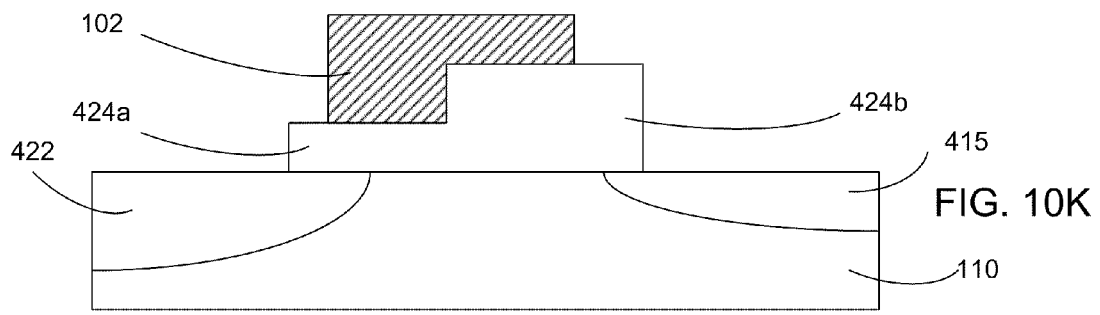

Referring to FIG. 10K, the photoresist 124 is then removed.

The p+ and n+ regions 414, 418, 420, can be implanted by conventional implanting processes, e.g., after the P-body 422 and NDD 415 have been implanted.

Although the fabrication of only one gate is illustrated in FIGS. 10*a*-10*g*, multiple gates, or the gate of a distributed transistor, can be fabricated simultaneously.

By including a photoresist layer over the polygate during the p-body implantation, a self-aligned p-body can be formed. Moreover, using the photoresist protects the remainder of the substrate from impurities caused during the implantation process. Further, by having two separate etching steps, before and after the implantation process, a single self-aligned p-body can be formed in the source side of the substrate.

Particular embodiments have been described. Other embodiments are within the scope of the following claims.

What is claimed is:

1. A transistor comprising:
   a source region including a first impurity region of a first impurity type implanted into a well region, also of the first impurity type, implanted on a substrate and a third impurity region of an opposite second impurity type abutting the first impurity region, and a fourth impurity region of the second impurity type surrounding the first impurity region and the third impurity region, the fourth impurity region having a lower doping concentration than the third impurity region;
   a drain region including a second impurity region of the first impurity type implanted into the substrate, the drain region further including a fifth impurity region of the first impurity type surrounding the second impurity region, the fifth impurity region having a lower doping concentration than the second impurity region;
   an intrinsic diode between the fourth impurity region and the drain region, the intrinsic diode formed by the fourth impurity region of the second impurity type and the well region of the first impurity type; and
   a gate including an oxide layer formed over the substrate and a conductive material formed over the oxide layer, the oxide layer comprising a first side and a second side, the first side formed over a portion of the first impurity region and the second side formed over a portion of the second impurity region, the first side having a thickness such that a turn-on voltage of the transistor is less than a forward bias turn-on voltage of the intrinsic diode;
   wherein:
   the fourth impurity region has a doping concentration of the second impurity type graded in a vertical direction such that doping concentration of the second impurity type increases when moving in the vertical direction from a surface adjacent to the oxide layer towards the substrate, and the doping concentration of the second impurity type in the fourth impurity region at the surface adjacent to the oxide layer is less than one-half of the doping concentration of the second impurity type at a portion of the fourth impurity region closest to the substrate, and
   a thickness of the first side of the oxide layer is greater than zero and less than 70 Å.

2. The transistor of claim 1, wherein the turn-on voltage of the transistor is between 0.4 and 0.6V.

3. The transistor of claim 1, wherein the fourth impurity region is self-aligning.

4. The transistor of claim 3, wherein the fourth impurity region is positioned in a current path of the transistor.

5. The transistor of claim 1, wherein a maximum doping concentration of the fourth impurity region is between $1 \times 10^{17}$ atoms/cm$^2$ and $1 \times 10^{18}$ atoms/cm$^2$.

6. The transistor of claim 1, wherein the transistor is a lateral double-diffused metal oxide semiconductor (LDMOS).

7. The transistor of claim 1, wherein the doping concentration of the second impurity type in the fourth impurity region at the surface adjacent to the oxide layer is greater than zero and less than $5 \times 10^{17}$ atoms/cm$^2$.

8. A system comprising:
   an input terminal and an output terminal;
   a high-side transistor between the input terminal and an intermediate terminal, having a source connected to the input terminal and a drain connected to the intermediate terminal;
   an output filter between the intermediate terminal and the output terminal; and
   a low-side transistor between ground and the intermediate terminal, having a source connected to ground and a drain connected to the intermediate terminal, comprising:
   a source region including a first impurity region of a first impurity type implanted into a well region, also of the first impurity type, implanted on a substrate, a third impurity region of an opposite second impurity type abutting the first impurity region, and a fourth impurity region surrounding the first impurity region and the third impurity region, the fourth impurity region having a lower doping concentration than the third impurity region;
   a drain region including a second impurity region of the first impurity type implanted into the substrate, the drain region further including a fifth impurity region of the first impurity type surrounding the second impurity region, the fifth impurity region having a lower doping concentration than the second impurity region;
   an intrinsic diode between the fourth impurity region and the drain region, the intrinsic diode formed by the fourth impurity region of the second impurity type and the well region of the first impurity type; and a gate including an oxide layer formed over the substrate and a conductive material formed over the oxide layer, the oxide layer comprising a first side and a second side, the first side formed over a portion of the first impurity region and the second side formed over a portion of the second impurity region, the first side having a thickness such that a turn-on voltage of the transistor is less than a forward bias turn-on voltage of the intrinsic diode;

wherein:

the fourth impurity region has a doping concentration of the second impurity type graded in a vertical direction such that doping concentration of the second impurity type increases when moving in the vertical direction from a surface adjacent to the oxide layer towards the substrate, and the doping concentration of the second impurity type in the fourth impurity region at the surface adjacent to the oxide layer is less than one-half of the doping concentration of the second impurity type at a portion of the fourth impurity region closest to the substrate, and a thickness of the first side of the oxide layer is greater than zero and less than 70 Å.

9. The system of claim 8, wherein the turn-on voltage of the low-side transistor is between 0.4 and 0.6V.

10. The system of claim 8, wherein the fourth impurity region is self-aligning.

11. The system of claim 8, wherein a maximum doping concentration of the fourth impurity region of the low-side transistor is between $1\times10^{17}$ atoms/cm$^2$ and $1\times10^{18}$ atoms/cm$^2$.

12. The system of claim 8, wherein the fourth impurity region of the low-side transistor is positioned in a current path of the transistor.

13. The system of claim 8, wherein the low-side transistor is a lateral double-diffused metal oxide semiconductor (LDMOS).

14. The system of claim 8, wherein the doping concentration of the second impurity type in the fourth impurity region at the surface adjacent to the oxide layer is greater than zero and less than $5\times10^{17}$ atoms/cm$^2$.

15. A transistor comprising:

a source region including a first impurity region of a first impurity type implanted into a well region, also of the first impurity type, implanted on a substrate and a third impurity region of an opposite second impurity type abutting the first impurity region, and a fourth impurity region of the second impurity type surrounding the first impurity region and the third impurity region, the fourth impurity region having a lower doping concentration than the third impurity region;

a drain region including a second impurity region of the first impurity type implanted into the substrate, the drain region further including a fifth impurity region of the first impurity type surrounding the second impurity region, the fifth impurity region having a lower doping concentration than the second impurity region;

an intrinsic diode between the fourth impurity region and the drain region, the intrinsic diode formed by the fourth impurity region of the second impurity type and the well region of the first impurity type; and a gate including an oxide layer formed over the substrate and a conductive material formed over the oxide layer, the oxide layer comprising a first side and a second side, the first side formed over a portion of the first impurity region and the second side formed over a portion of the second impurity region, the first side having a thickness such that a turn-on voltage of the transistor is less than a forward bias turn-on voltage of the intrinsic diode;

wherein:

the fourth impurity region has a doping concentration of the second impurity type graded in a vertical direction such that doping concentration of the second impurity type increases when moving in the vertical direction from a surface adjacent to the oxide layer towards the substrate, and the doping concentration of the second impurity type in the fourth impurity region at the surface adjacent to the oxide layer is less than one-half of the doping concentration of the second impurity type at a portion of the fourth impurity region closest to the substrate, and a thickness of the first side of the oxide layer is greater than zero and less than 125 Å.

16. The transistor of claim 15, wherein the doping concentration of the second impurity type in the fourth impurity region at the surface adjacent to the oxide layer is greater than zero and less than $1\times10^{16}$ atoms/cm$^2$.

* * * * *

UNITED STATES PATENT AND TRADEMARK OFFICE
CERTIFICATE OF CORRECTION

PATENT NO. : 9,293,577 B2
APPLICATION NO. : 12/750568
DATED : March 22, 2016
INVENTOR(S) : Zuniga Page 1 of 1

It is certified that error appears in the above-identified patent and that said Letters Patent is hereby corrected as shown below:

IN THE SPECIFICATION

Column 3, line 4, "include one or of the" should read -- include one or more of the --;
Column 3, line 8, "that it at least" should read -- that is at least --;
Column 3, lines 10 and 11, "substrate with atoms at an that is less" should read -- substrate with atoms at an angle that is less --;
Column 3, line 38, "include one or of the" should read -- include one or more of the --;
Column 3, line 48 and 49, "simuataneously" should read -- simultaneously --;
Column 5, line 30, "Vint" should read -- $V_{in}$ --.

Signed and Sealed this
Seventh Day of June, 2016

Michelle K. Lee
*Director of the United States Patent and Trademark Office*

UNITED STATES PATENT AND TRADEMARK OFFICE
CERTIFICATE OF CORRECTION

PATENT NO. : 9,293,577 B2  
APPLICATION NO. : 12/750568  
DATED : March 22, 2016  
INVENTOR(S) : Zuniga Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 474 days.

Signed and Sealed this
Twenty-first Day of June, 2016

Michelle K. Lee
*Director of the United States Patent and Trademark Office*